United States Patent [19]

Misono et al.

[11] Patent Number: 4,801,949

[45] Date of Patent: Jan. 31, 1989

[54] CAPSULE RUPTURE PRINTING SYSTEM

[75] Inventors: Shigemi Misono; Katsuhiro Konno, both of Tokyo, Japan

[73] Assignee: Seiko Instruments Inc., Tokyo, Japan

[21] Appl. No.: 112,091

[22] Filed: Oct. 21, 1987

[30] Foreign Application Priority Data

Nov. 4, 1986 [JP] Japan .................................. 61-263006
Nov. 4, 1986 [JP] Japan .................................. 61-263007

[51] Int. Cl.⁴ ..................... G01D 15/10; G03B 27/30; G03C 1/72
[52] U.S. Cl. .................. 346/76 L; 430/138; 355/100; 346/108
[58] Field of Search .............. 346/76 L, 108, 160; 430/138; 355/27, 100

[56] References Cited

U.S. PATENT DOCUMENTS 4,581,312 4/1986 Nakahara ............................. 430/138
4,624,560 11/1986 Beery .................................. 430/138

Primary Examiner—E. A. Goldberg
Assistant Examiner—Mark Reinhart
Attorney, Agent, or Firm—Bruce L. Adams; Van C. Wilks

[57] ABSTRACT

An apparatus is provided for use in printing systems wherein regions of rupturable capsules of a layer of capsules adsorbed on an imaging sheet are ruptured to release chromogenic materials that react to developer and print an image on a sheet. The apparatus has a container storing the capsules. A separately prepared sheet of plain paper is fed into the apparatus where the capsules are adsorbed thereon, forming an imaging sheet. Then an image is outputted from the apparatus through exposure process and development process. As a consequence, the user do not directly touch capsules which are vulnerable to friction and rubs, and this facilitates the handling of the imaging sheet.

8 Claims, 8 Drawing Sheets

FIG. 12
FIG. 14
FIG. 13
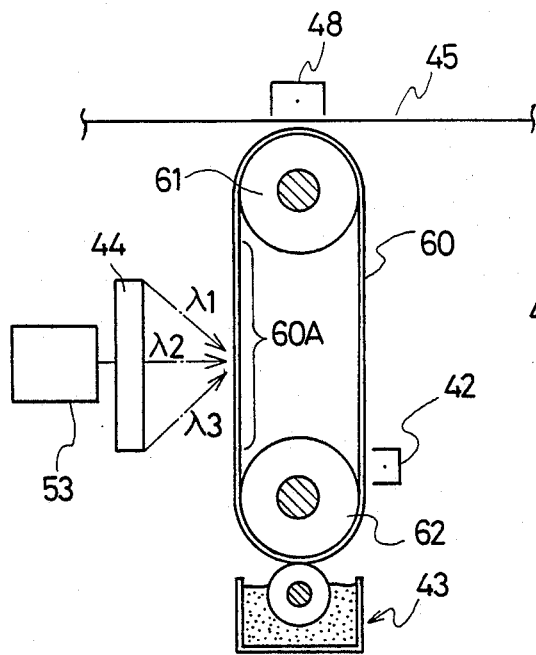
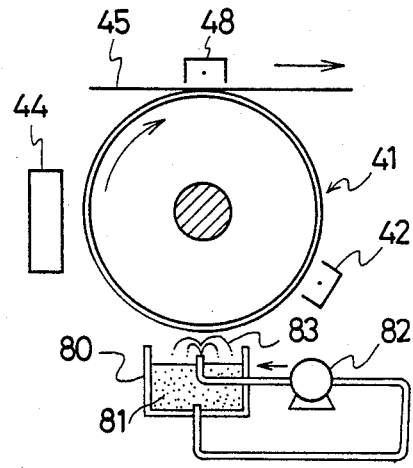
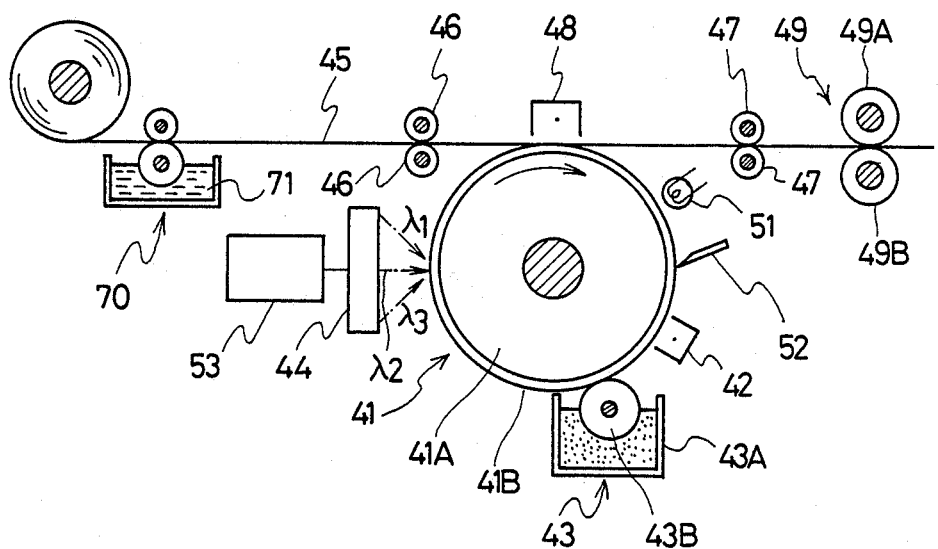

CAPSULE RUPTURE PRINTING SYSTEM

BACKGROUND OF THE INVENTION

This invention relates to a capsule rupture printing system for recording an image in an imaging sheet with a layer of subminiature capsules. U.S. Pat. Nos. 4,399,209 and 4,440,846 and U.K. Pat. No. GB2,113,860 to The Mead Corporation describe an imaging system wherein a photosensitive layer comprising microcapsules containing a photosensitive composition in the internal phase is image-wise exposed to actinic radiation and subjected to a uniform rupturing force whereupon the microcapsules rupture and image-wise exposed to actinic radiation and subjected to a uniform rupturing force whereupon the microcapsules rupture and image-wise release the internal phase. An image-forming agent such as a substantially colorless chromogenic materials are typically associated with the microcapsules such that when the microcapsules rupture the chromogenic materials are typically associated with the microcapsules such that when the microcapsules rupture the chromogenic materials are able to image-wise react with a developer material and produce a color image. Since this printing system can reproduce pixels in the same size as the size of the microcapsules, that is, in the order of $\mu m$, a color image can be printed with extremely high resolution.

However, since the microcapsules coated on the sheet-like support is extremely weak against friction and abrasion, storage of the imaging sheet with a layer of capsules and its handling at the time of printing must be made with the greatest possible care so that the image sheet is very troublesome to handle.

SUMMARY OF THE INVENTION

An object and advantage of the present invention is to provide a novel color printing system which is possible to prevent the touch of hands to the microcapsules on a imaging sheet till completion of development, to minimize the rupture of the microcapsules by ill usage and to improve quality of the image.

Another object of the present invention is to provide a novel color printing system which needs not pay attention to storage of the imaging sheet and its handling at the time of printing.

Still another object of present invention is to provide a novel color printing system in which microcapsules are adsorbed electrostatically on the support sheet, so that binder resin becomes unnecessary and the properties of the microcapsules of their own can be fully utilized.

The above and other related objects and features of the invention will be apparent from a reading of the following description of the disclosure found in the accompanying drawings and novelty thereof pointed out in the apended claims.

BRIEF DESCRIPTION OF THE DRAWINGS

FIG. 12 is a system construction view, similar to FIG. 10, showing a dielectric member in the belt-like form;

FIG. 13 is a system construction view representing still another embodiment of the present invention; and FIG. 14 is a sectional view representing still another embodiment of microcapsule supply means shown in FIG. 10.

DESCRIPTION OF THE PREFERRED EMBODIMENT

Hereinafter, the present invention will be explained in detail with reference to some embodiments thereof shown in the accompanying drawings.

Figure 7:
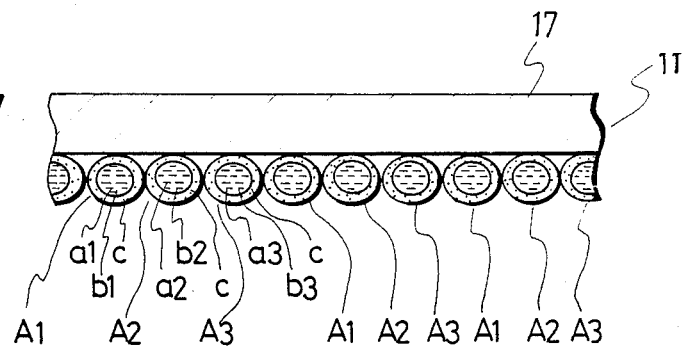
FIG. 7 is a sectional view of the imaging sheet used in the present invention.
Figure 9:
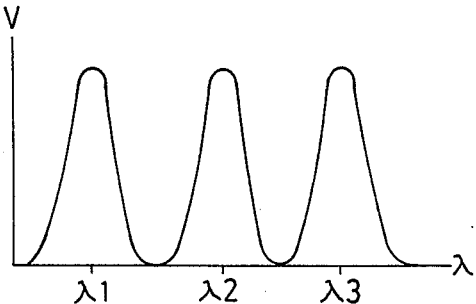
FIG. 9 is an explanatory view showing the sensitive spectral of the imaging sheet shown in FIG. 7.

FIG. 7 shows a simplified structure of the imaging sheet 11 used in this invention. reference symbols $A_1$, $A_2$, $A_3$ denote microcapsules presenting colors of cyan, magenta and yellow, respectively. Chromogenic materials $a_1$, $a_2$, $a_3$ which generate cyan, magenta and yellow, respectively, and photosensitive composition $b_1$, $b_2$, $b_3$ which immobilize the chromogenic materials by changing the viscosity etc. as a result of reaction to electromagnetic beams of which wavelengths $\lambda_1$, $\lambda_2$, $\lambda_3$ correspond to the colors of the chromogenic materials (see FIG. 9) such as light beams, are microcapsulated by surrounding thin films C made of gelatin etc. The microcapsules are coated evenly on the surface of the sheet 17 forming carrier so as to constitute an imaging sheet 11.

Figure 8:
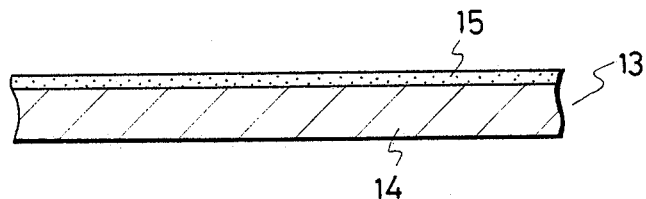
FIG. 8 is a sectional view of the image-receiving sheet used in the present invention.

FIG. 8 denotes an image-receiving sheet 13 to be used with the imaging sheet 11. It is constituted by coating a developing material 15, which generates colors in response to the chromogenic materials $a_1$, $a_2$, $a_3$, on the surface of a sheet 14 forming carrier.

When the above mentioned imaging sheet 11 is exposed to the light having the wave-lengths to which the photosensitive composition $b_1$, $b_2$, $b_3$ within the microcapsules $A_1$, $A_2$, $A_3$ react, the viscosity of the photosensitive composition $b_1$, $b_2$, $b_3$ changes. Then, the imaging sheet 11, thus exposed, is united with the image-receiving sheet 13 into one body and pressure is added to the united body so that the capsules $A_1$, $A_2$, $A_3$ are broken. As a result, there comes out a difference in the amount of the chromogenic materials flown out of the capsules between the capsules exposed to light and those unexposed. Consequently, colors corresponding to the wave lengths $\lambda_1$, $\lambda_2$, $\lambda_3$ of the projecting light are presented on the image-receiving sheet 13. That is, color patterns in accordance with the patterns presented at the time of light projection can be obtained.

Figure 1:
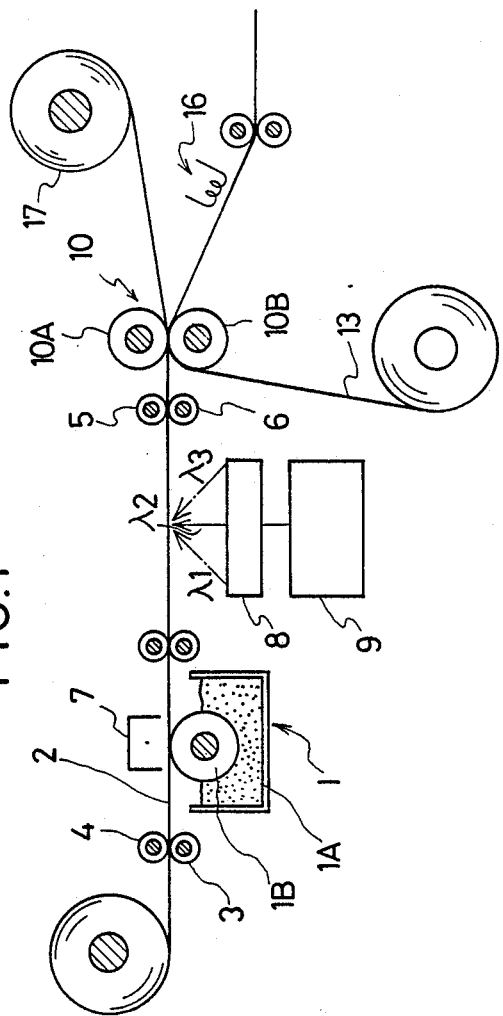
FIG. 1 is a system construction view representing one embodiment of the invention.

FIG. 1 shows one embodiment of the present invention. In the drawing, reference numeral 1 represents microcapsule supply means, which consists of a tank 1A for storing a liquid dispersing therein the microcapsules and a suction roller 1B which is normally dipped at its lower part into this liquid and is connected to a driving source not shown. A support sheet 2 is placed on the upper surface of the suction roller 1B of the microcapsule supply means 1 by rollers 3, 4 and 5, 6 and is moved in a tangential direction at the same speed as rotational speed of the suction roller 1B. A charging device 7 for supplying charge to the support sheet 2 is disposed at a position facing the suction roller 1B in such a manner as to interpose the support sheet 2 between them. The support sheet 2 is made of plain paper or transparent film such as PET film. The microcapsules adhere to the support sheet 2 while the support sheet 2 is passing through the microcapsule supply means 1, and the support sheet 2 becomes the imaging sheet. Reference numeral 8 represents an optical modulator which is disposed downstream of the microcapsule supply means 1. The optical modulator 8 radiates the beams having the sensititve wavelengths of the microcapsules $\lambda_1$, $\lambda_2$, and $\lambda_3$ in response to image signals from an optical controller 9. Reference numeral 10 represents a developing equipment disposed further downstream of the optical modulator 8 and consisting of pressure rollers 10A and 10B having a pressure sufficient to rupture the microcapsules. The developing equipment 10 ruptures the microcapsules while the imaging sheet faces a image-receiving sheet 13 on which a developing solution is coated.

Figure 2:
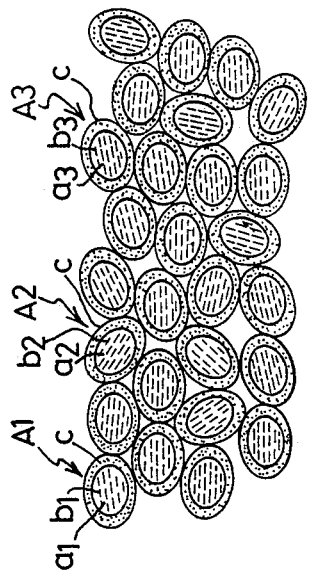
FIG. 2 is an explanatory view showing the microcapsules used in the present invention.

In this embodiment, the microcapsules shown in FIG. 2 are prepared by capsulating chromogenic materials $a_1$, $a_2$, $a_3$ generating the cyan, Magenta and yellow colors and photosensitive compositions $b_1$, $b_2$, $b_3$ that change their viscosity upon sensing electromagnetic beams having mutually different wavelength $\lambda_1$, $\lambda_2$, $\lambda_3$ for the respective chromogenic materials (see FIG. 9) such as optical beams and inactivate the chromogenic materials, by a thin film c of gelatin or the like, are dispersed in a liquid and the tank 1A of the microcapsule supply means 1 is filled with this dispersion.

Figure 3A:
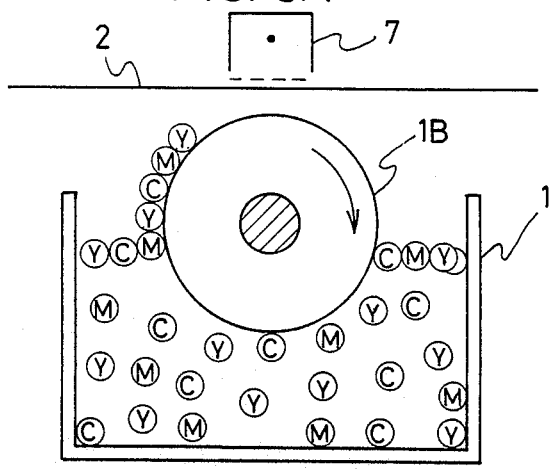
FIGS. 3A-3D are explanatory views showing the operation of the system shown in FIG. 1.
Figure 3B:
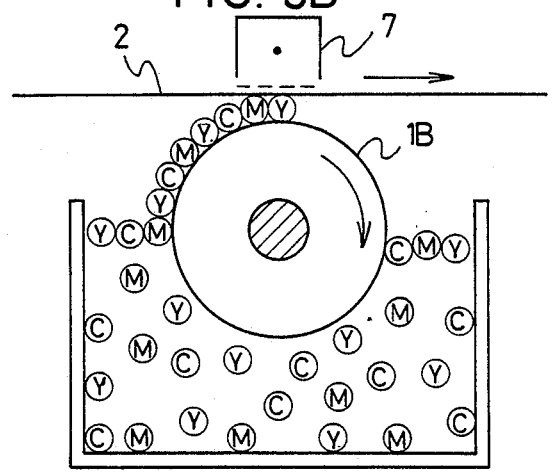
Figure 3C:
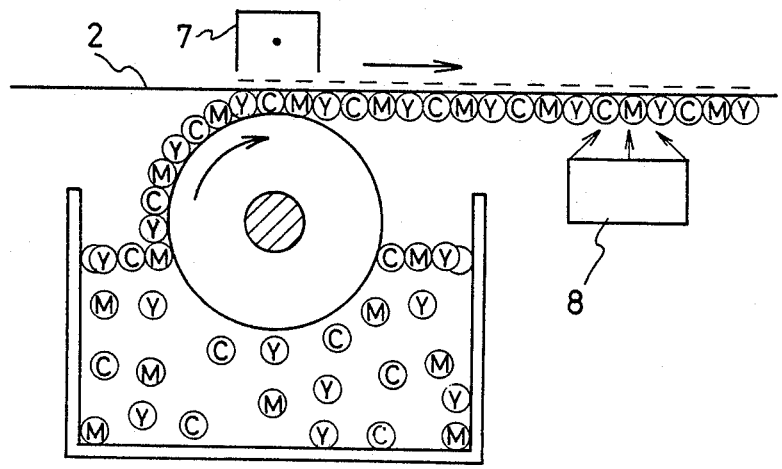

After the preparation described above is complete, the printing system is operated. Then, the suction roller 1B receives the power from the driving source and rotates in a direction represented by an arrow in FIG. 3A and conveys the microcapsules towards the support sheet 2 with the liquid. The microcapsules facing the support sheet 2 are affected by the electric field from the charging device 7, are adsorbed to the surface of the support sheet 2 (see FIG. 3B) and move towards the optical modulator 8. At this point of time, when image signals of the image whose hard copy is to be obtained are outputted from optical controller 9 to the optical modulator 8, the optical modulator 8 scans the imaging sheet 11 in its transverse direction by each optical beam of each wavelength $\lambda_1$, $\lambda_2$, $\lambda_3$ controlled the optical intensity in response to the image signals (see FIG. 3C). Accordingly, the microcapsules adsorbed on the surface of the support sheet 2 are cured in response to the quantity of the spectral beam and form latent images. Thereafter, the image signals are written by scanning the imaging sheet 11 in its transverse direction by the optical beam in synchronism with the moving speed of the imaging sheet.

Figure 3D:
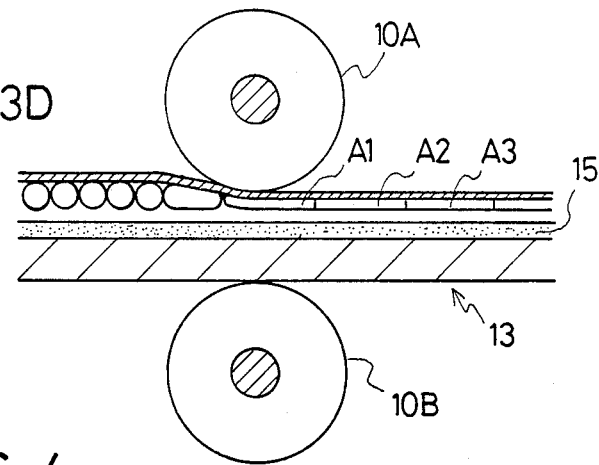

The imaging sheet on which the latent images of the three primary colors are formed in the manner described above is superposed with the image-receiving sheet 13 in the developing equipment 10 and a pressure is then applied thereto (see FIG. 3D).

At this time, each photosensitive composition $b_1$, $b_2$, $b_3$ sealed in the microcapsule $A_1$, $A_2$, $A_3$ on the imaging sheet 11 is cured in accordance with the exposure quantity so that the amounts of the chromogenic materials flowing out from the capsules $A_1$, $A_2$, $A_3$ are different from one another in response to the exposure quantity. Accordingly, the chromogenic materials $a_1$, $a_2$, and $a_3$ soak out from the imaging sheet 11 into the image-receiving sheet 13 pressed in the developing equipment 10 in the amounts corresponding to the exposure quantity.

The imaging sheet 11 leaving the developing equipment 10 is taken up by a take-up reel 17 and the image-receiving sheet 13 is heated by a heat roller 16. Since this heat treatment accelerates the reaction between the chromogenic materials $a_1$, $a_2$, $a_3$ soaking out from the microcapsules $A_1$, $A_2$, $A_3$ on the imaging sheet 11 and the developer on the image-receiving sheet 13, the colors are generated in accordance with the image signals and a color pattern is reproduced in accordance with the input image signals. Needless to say, since a large number of microcapsules $A_1$, $A_2$, $A_3$ reproducing the three primary colors are adsorbed uniformly on the surface of the imaging sheet 11, the reproduced color image is expressed as the aggregate of very small three primary color pigments determined substantially by the particle size of the microcapsules, and the colors are reproduced while each primary color is mixed with the other.

In the embodiment described above, the microcapsules are ruptured by applying the pressure to the sheet, but the same effect can be obtained by rupturing the microcapsules by bringing an oscillation plate equipped with a ultrasonic oscillation member into pressure contact with the microcapsules or by radiating a microwave or heat rays to them so as to thermally break the microcapsules.

In the embodiment described above, the image signals are written while scanning the optical beam, but the latent images can be formed by one-shot process by projecting the image at the point of time when the microcapsules are coated to the area which is to be printed.

Figure 4:
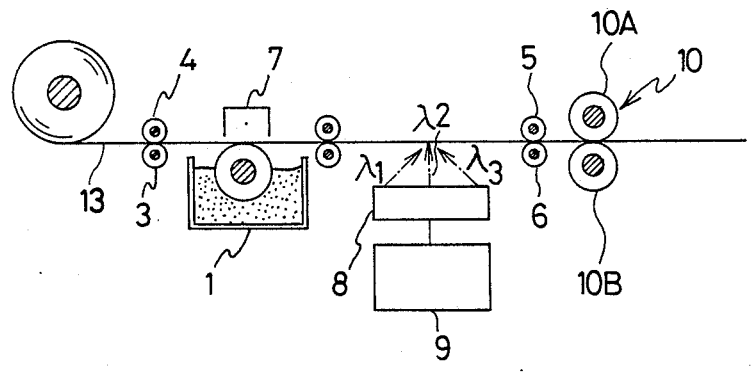
FIGS. 4 and 5 are system construction views representing other embodiments of the present invention, respectively.

Furthermore, though the microcapsules are adsorbed electrostatically on the non-treated support sheet 2, the microcapsules can be adsorbed on the surface of the image-receiving sheet 13 by conveying the developer layer 15 side of the image-receiving sheet 13 while facing the suction roller 1B as shown in FIG. 4. This method eliminates the necessity of the support sheet 2 and can reduce the running cost.

Figure 5:
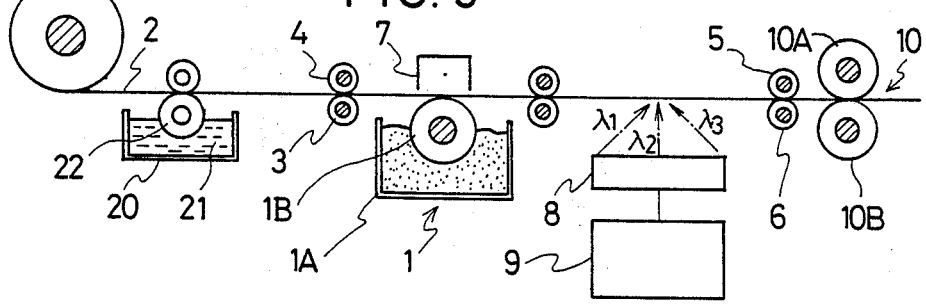

FIG. 5 shows another embodiment of the present invention, wherein a developing solution coater 20 is disposed upstream of the microcapsule supply means 1. When the printing system is operated, the support sheet 2 passes through the developing solution coater 20 so that the developing solution coater 20 so that the developing solution 21 can be coated uniformly on surface of the sheet. The portion of the sheet coated with the developing solution moves to the microcapsule supply means 1, where microcapsules are coated on the portion coated with the developing solution, the support sheet 2 becomes the imaging sheet with microcapsules on the developing solution coated on the surface of it. The imaging sheet is exposed by the optical beams from the optical modulator 8 and forms the latent images. The portion of the imaging sheet where the latent images are formed moves to the developing equipment 10, and the microcapsules on the surface of the imaging sheet are ruptured there by the pressure, react with the developing solution coated on the sheet surface and reproduce the color pattern in response to the image signals.

This embodiment eliminates the necessity of the developing sheet and the trouble of storage of the developing sheet and can reduce the running cost. Moreover, the rapid reaction can be made because the chromogenic materials of the press-ruptured microcapsules are reacted with the developing solution under the wetted stage.

Figure 6:
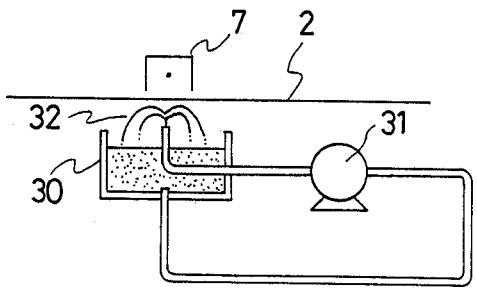
FIG. 6 is a sectional view representing still another embodiment of microcapsule supply means shown in FIG. 1.

FIG. 6 shows another example of the microcapsule supply means used for the system described above. The liquid dispersing therein the microcapsules and stored in the tank 30 is supplied as a jet stream 32 to the support sheet 2 while being circulated by a pump 31. In accordance with this embodiment, the microcapsules can be stirred uniformly without using any specific stirrer, in particular.

Figure 10:
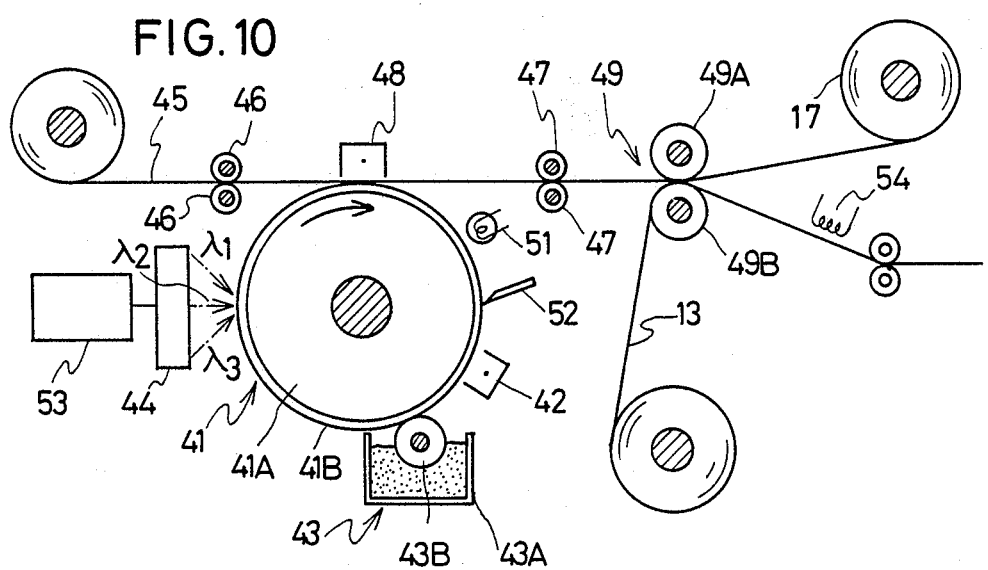
FIG. 10 is a system construction view representing still another embodiment of the present invention.

FIG. 10 shows other embodiment of the present invention. In the drawing, reference numeral 41 represents an endless dielectric member, which includes a dielectric layer 41B consisting of a photoconductive film or a polymer film formed on the surface of a draum 41A which is connected to a driving source not shown in the drawing. A charging device 42 for supplying uniformly charge to the dielectric layer 41B, a later-appearing microcapsule supply means 43 and an optical modulator 44 for radiating beams of sensitive wavelengths of microcapsules $\lambda_1$, $\lambda_2$, $\lambda_3$ in response to image signals are disposed around the periphery of the dielectric member from the upstream side of its rotation represented by arrow in the drawing.

Reference numeral 43 represents the microcapsule supply means described above, which consists of a suction roller 43B dipped normally into a liquid inside a tank 43A for storing the microcapsules dispersed in the liquid and in contact with the surface of the dielectric member 41. Reference numeral 45 represents a support sheet such as ordinary paper which is supplied in a roll form. It faces the surface of the dielectric member 41 at a position downstream of an optical modulator 44 and is stretched by guide rollers 46, 46 and 47, 47 in such a manner as to be capable of moving in a tangential direction at the same speed as the rotational speed of the dielectric member 41. A second charging device 48 is disposed at a position opposite to the dielectric member 41 in such a manner as to interpose the support sheet 45 between them. Reference numeral 49 represents a developing equipment disposed downstream of the dielectric member 41 and consisting of pressure rollers 49A, 49B having a pressure sufficient to rupture the microcapsules. The developing equipment 49 is constituted such that it can rupture the microcapsules by pressure while facing a image-receiving sheet 13 on which a developing solution is applied. In the drawing, referece numeral 51 represents an eraser lamp which permits easy escape of residual charge when the dielectric member 41 is composed of a photoconductive material, 52 is a cleaning device for removing the microcapsules remaining on the surface of the dielectric member 41 and 53 is an optical control circuit. The microcapsules showed in FIG. 2 are dispersed in a liquid and the tank 43A of the capsule supply means 43 is filled with this dispersion.

Figure 11A:
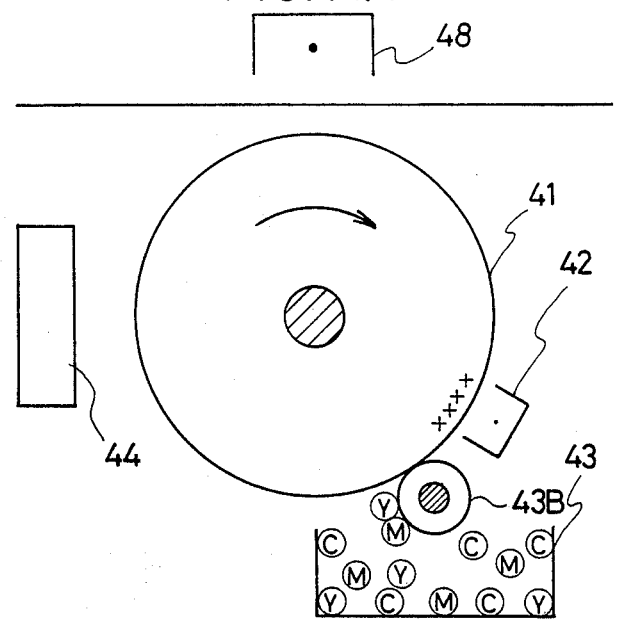
FIGS. 11A-11F are explanatory views showing the operation of the system shown in FIG. 10.
Figure 11B:
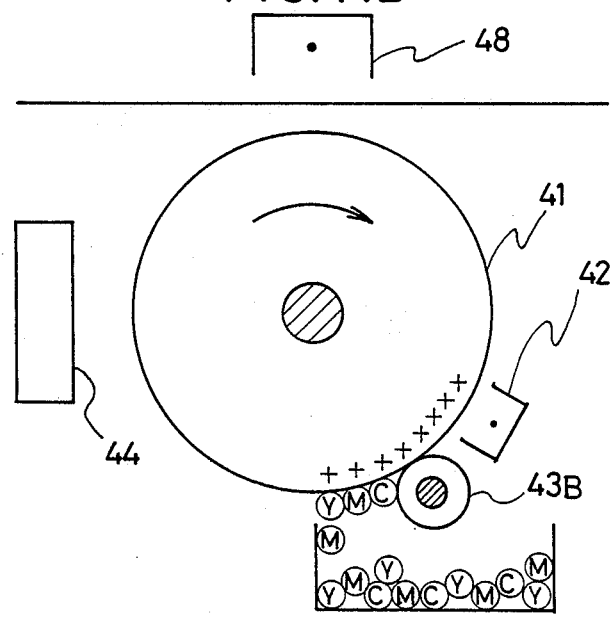
Figure 11C:
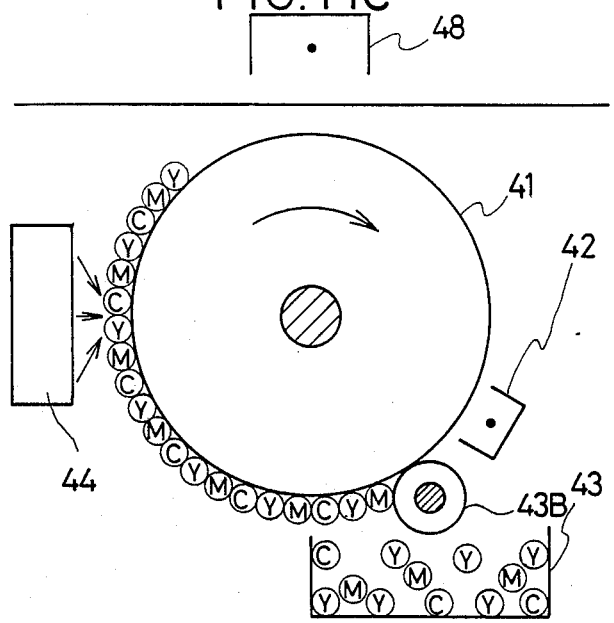

When the printing system is operated at the stage where the preparation described above is complete, the dielectric member 41 receives the power from the driving source, rotates in the direction represented by the arrow in the drawing, is sequentially charged to a predetermined potential at the surface of it, and is placed with its rotation at the position facing the microcapsule supply means 43 (see FIG. 11A). The microcapsules sensitive to each wavelength attach to the surface of the roller 43B together with the liquid dispersing them, are sucked up by the dielectric member 41, adsorbed electrostatically on the surface of the dielectric member 41 as they are attracted by the potential of the dielectric member and attach thereto uniformly (see FIG. 11B). The microcapsules thus adsorbed on the surface of the dielectric member 41 move to the optical modulator 44 with the rotation of the dielectric member 41. When the image signals for obtaining a hard copy are outputted to the optical modulator 44 at this point of time, the optical modulator 44 scans the optical beam of each wavelength $\lambda_1$, $\lambda_2$, $\lambda_3$ in the axial direction of the dielectric member 41 while controlling the optical intensity in response to the image signals. Accordingly, the microcapsules adsorbed on the surface of the dielectric member 41 are cured in response to the optical quantity of the spectral light and form latent images. Thereafter, the optical beam is scanned in the axial direction of the dielectric member 41 while keeping synchronism with the rotating speed of the dielectric member 41 to write the image signals (see FIG. 11C).

Figure 11D:
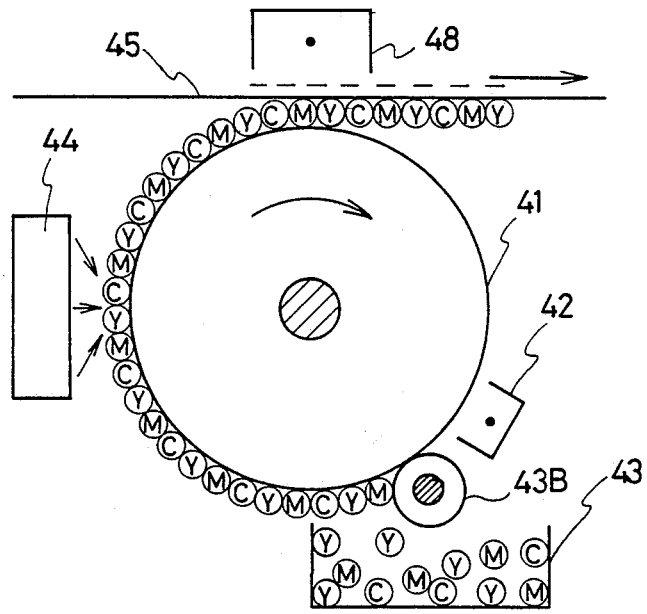

The microcapsules receiving the optical irradiation are conveyed with the rotation of the dielectric member 41 to the position where they face the support sheet 45, which moves at the same moving speed as the rotational speed of the dielectric member 41, receive the electrostatic field from the second charging device 48 and are attracted to the surface of the support sheet 45. Thereafter, the micorocapsules that are sequentially cured optically are adsorbed on the support sheet 45 and the latent images are transferred from the dielectric member 41 to the support sheet 45 (see FIG. 11D).

Figure 11E:
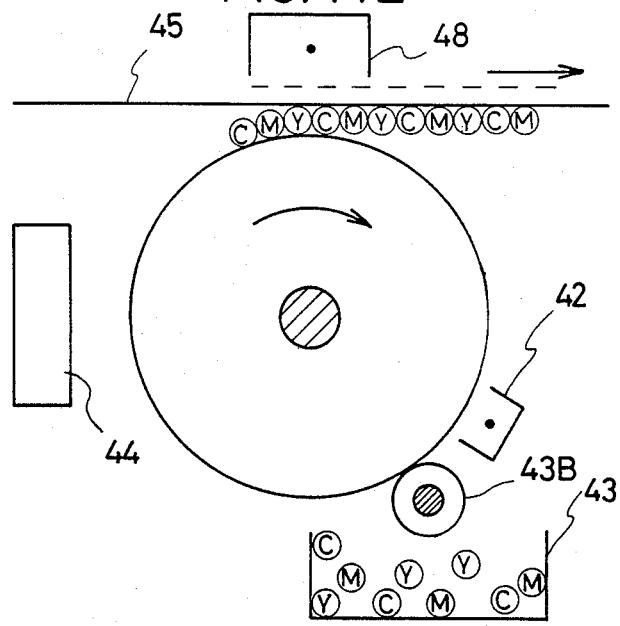
Figure 11F:
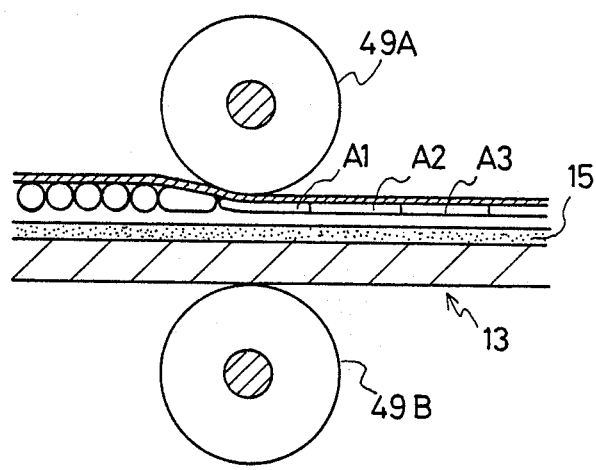

The sheet on which the latent images of the three primary colors are thus transferred (see FIG. 11E) is put together with the image-receiving sheet 13 and a pressure is applied thereto (see FIG. 11F).

At this time, each photosensitive composition $b_1$, $b_2$, $b_3$ sealed in the microcapsules $A_1$, $A_2$, $A_3$ on the support sheet 45 is cured in accordance with the exposure quantity so that the amounts of the chromogenic materials flowing out of the capsules $A_1$, $A_2$, $A_3$ are different from one another in response to the exposure quantity. Accordingly, the chromogenic materials $a_1$, $a_2$, $a_3$ soak out of the support sheet 45 into the image-receiving sheet 13 pressed in the developing equipment 49 in the amounts corresponding to the exposure quantity.

The support sheet 45 leaving the developing equipment 49 is taken up by a take-up reel 17 and the image-receiving sheet 13 is heated by a heat roller 54. since this heat accelerates the reaction between the chromogenic materials $a_1$, $a_2$, $a_3$ soaking out of the microcapsules $A_1$, $A_2$, $A_3$ of the support sheet 45 and the developer 15, the colors are generated in accordance with the image signals and a color pattern is reproduced in accordance with the input image signals.

On the other hand, the dielectric member 41 that has delivered the microcapsules to the support sheet 45 is eliminated electrostatic attraction force as its surface charge by the irradiation with light from the eraser lamp 51, and the microcapsules remaining on the surface of the dielectric member 41 are removed by the cleaning device 52 to prepare for the next printing operation.

In this embodiment, the microcapsules are transferred to the untreated support sheet, but it is also possible to transfer them to the surface of the image-receiving sheet 13. Such a method eliminates the necessity of the support sheet and can reduce the running cost.

Though the dielectric member 41 is shaped in the cylindrical form in the embodiment described above, obviously the same effect can be obtained by shaping the dielectric member 60 in the belt-like form, stretching it by rollers 61 and 62 as shown in FIG. 12 and disposing the charging device 42, the microcapsule supply means 43 and the second charging device 48 on its surface. Since a flat surface portion 60A having a wide area can be formed by this arrangement, one-shot writing can be made by projecting the image to be printed.

FIG. 13 shows another embodiment of the present invention, wherein a developing solution coater 70 is disposed upstream of the dielectric member 41 in the conveying direction of the support sheet 45. When the printing system is operated in this embodiment, the support sheet 45 passes through the developing solution coater 70 so that the developing solution 71 can be applied uniformly on the sarface of the support sheet 45. This portion coated with the developing solution 71 moves to the dielectric member 41, attracts electrostatically the microcapsules after completion of exposure and forms the latent images on the surface of the dielectric member 41. The portion where the latent images are formed moves to the developing equipment 49 and the microcapsules attaching to the surface are pressure-ruptured, react with the developing solution applied to the surface of the sheet 45 and develop a color pattern corresponding to the image signals.

This embodiment eliminates the necessity of the image-receiving sheet and the trouble of storage of the sheet and can therefore reduce the running cost. Moreover, the rapid reaction can be made because the chromogenic materials of the pressure-ruptured microcapsules are reacted with the developing solution under the wetted state.

FIG. 14 shows another embodiment of the microcapsule supply means used in the printing system shown in FIG. 10, FIG. 12 and FIG. 14. A liquid 81 dispersing the microcapsules therein and stored in the tank 80 is supplied in the form of a jet stream 83 having expansion in the axial direction of the dielectric member 41 while being circulated by a pump 82. According to this embodiment, the microcapsules can be stirred uniformly and supplied to the dielectric member 41 without using any spacific stirrer.

In accordance with the present invention described above, the microcapsules are dispersed in the liquid and electrostatically adsorbed on the support sheet, or dispersed in the liquid and transferred to the support sheet after being adsorbed to the dielectric member. Therefore, it is possible to prevent the touch of hands to the microcapsules till completion of development, to minimize the rupture of the microcapsules by ill usage and to improve quality of the image.

Furthermore, since the microcapsules are adsorbed electrostatically on the support sheet, the binder resin becomes unnecessary and the properties of the microcapsules of their own can be fully utilized. Therefore, a high quality image can be obtained.

Furthermore, since the optical beams are radiated to the microcapsules attaching to the dielectric member whose surface can be made flat more easily than than of the sheet, the optical radiation points can be located and controlled accurately and a high quality image can be therefore obtained.

Furthermore, since the microcapsules can be supplied in the container to users, it is possible to prevent rupture of the microcapsules during the marketing process.

What is claimed is:

1. An apparatus for forming an image on a sheet by rupturing at least some chromogenic materials-containing capsules, comprising:
    means for supplying said capsules to a support sheet;
    means for adsorbing said capsules to the surface of said support sheet by electrostatic attraction, disposed at an adsorption station facing said capsule supply means;
    means for radiating optical beams to said support sheet in response to image signals, disposed downstream of said capsule supply means;
    means for rupturing said capsules adsorbed on said support sheet; and
    means for moving said support sheet past said adsorption station, said optical beams radiate means and said capsule rupture means.
2. The apparatus described in claim 1, wherein:
    said capsule supply means consisting of a suction roller immersed at the lower part thereof in a liquid containing capsules dispersed therein which is filled in a container.
3. The apparatus described in claim 1, wherein:
    said capsule supply means consisting of a pump for circulating a liquid containing capsules dispersed therein and blowing said liquid against said support sheet.
4. An apparatus for forming an image on a sheet by rupturing at least some chromogenic materials-containing capsules, comprising:
    an endless dielectric member capable of storing charge on the surface thereof and capable of rotating;
    means for supplying charge to the surface of said endless dielectric member;
    means for supplying said capsules to said charged surface of said endless dielectric member by electrostatic attraction of said charge;
    means for radiating optical beams to said capsules on said endless dielectric member in response to image signals;
    means for adsorbing said capsules on said endless dielectric member to the surface of a support sheet by electrostatic attraction, disposed at an adsorption station facing said endless dielectric member;
    means for rupturing said capsules adsorbed on said support sheet; and
    means for moving said support sheet past said adsorption station and said capsule rupture means.
5. The apparatus described in claim 4, wherein:
    said dielectric member is shaped in the cylindrical.
6. The apparatus described in claim 4, wherein:
    said dielectric member is shaped in the belt-like form, stretched by rollers.
7. The apparatus described in claim 4, wherein:
    said capsule supply means consisting of a suction roller immersed at the lower part thereof in a liquid containing capsules dispersed therein which is filled in a container.
8. The apparatus described in claim 4, wherein:
    said capsule supply means consisting of a pump for circulating a liquid containing capsules dispersed therein and blowing said liquid against said dielectric member.

* * * * *